(12) United States Patent
Basker et al.

(10) Patent No.: US 9,559,000 B1
(45) Date of Patent: *Jan. 31, 2017

(54) HYBRID LOGIC AND SRAM CONTACTS

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/209,791

(22) Filed: Jul. 14, 2016

Related U.S. Application Data

(63) Continuation of application No. 14/945,497, filed on Nov. 19, 2015.

(51) Int. Cl.
*H01L 21/768* (2006.01)
*H01L 27/11* (2006.01)
(Continued)

(52) U.S. Cl.
CPC ... *H01L 21/76897* (2013.01); *H01L 21/76805* (2013.01); *H01L 21/76843* (2013.01);
(Continued)

(58) Field of Classification Search
CPC ............. H01L 27/1104; H01L 27/0886; H01L 27/0924; H01L 21/8239; H01L 21/823821; H01L 21/823814; H01L 21/02532; H01L 29/785; H01L 29/165; H01L 29/7848; H01L 29/66795; H01L 29/42372; H01L 29/66833; H01L 29/792; H01L 29/7851; H01L 29/41791
See application file for complete search history.

(56) References Cited

U.S. PATENT DOCUMENTS 5,731,242 A    3/1998  Parat et al.
6,284,593 B1   9/2001  Mandelman et al.
(Continued)

OTHER PUBLICATIONS

AUTH, "22-nm Fully-Depleted Tri-Gate CMOS Transistors", Proceedings of the IEEE Custom Integrated Circuits Conference (CICC), (2012), pp. 1-6.
(Continued)

*Primary Examiner* — Mohsen Ahmadi
(74) *Attorney, Agent, or Firm* — L. Jeffrey Kelly

(57) ABSTRACT

The method includes forming a first opening in a dielectric layer exposing a source drain region of an SRAM device and forming a second opening in the dielectric layer exposing a source drain region of a logic device, forming a third opening in the dielectric layer exposing a gate of the SRAM device and forming a fourth opening in the dielectric layer exposing a gate of the logic device, forming a first sidewall spacer in the third opening and forming a second sidewall spacer in the fourth opening, recessing a portion of the first sidewall spacer without recessing the second sidewall spacer, forming a strapped contact in the first and third openings, the strapped contact creates an electrical connection between the source drain region of the SRAM device and the gate of the SRAM device, the electrical connection is directly above a remaining portion of the first sidewall spacer.

1 Claim, 15 Drawing Sheets

(51) Int. Cl.
*H01L 29/78* (2006.01)
*H01L 23/535* (2006.01)

(52) U.S. Cl.
CPC ........ *H01L 23/535* (2013.01); *H01L 27/1104* (2013.01); *H01L 27/1116* (2013.01); *H01L 29/785* (2013.01)

(56) References Cited

U.S. PATENT DOCUMENTS

| | | |
|---|---|---|
| 6,620,677 B1 | 9/2003 | Hummler |
| 6,967,408 B1 | 11/2005 | Ko |
| 6,974,743 B2 | 12/2005 | Divakaruni et al. |
| 7,633,109 B2 | 12/2009 | Lee et al. |
| 7,875,519 B2 | 1/2011 | Rachmady et al. |
| 8,409,942 B2 | 4/2013 | Scheiper et al. |
| 8,436,404 B2 | 5/2013 | Bohr et al. |
| 8,440,533 B2 | 5/2013 | Toh et al. |
| 8,728,927 B1 | 5/2014 | Cheng et al. |
| 9,059,312 B2 | 6/2015 | Matsumoto |
| 2003/0054612 A1* | 3/2003 | Cho ................. H01L 21/76895 438/279 |
| 2006/0105536 A1* | 5/2006 | Cheng ............ H01L 21/823807 438/386 |
| 2008/0150049 A1 | 6/2008 | Rahhal-Orabi |
| 2009/0079027 A1* | 3/2009 | Cheng ................... H01L 21/84 257/522 |
| 2009/0212332 A1 | 8/2009 | Wang et al. |
| 2010/0320509 A1 | 12/2010 | Knorr et al. |
| 2012/0112261 A1* | 5/2012 | Zhu ....................... H01L 21/845 257/316 |
| 2013/0175594 A1* | 7/2013 | Basker ................... H01L 21/84 257/301 |
| 2013/0178052 A1 | 7/2013 | Fan et al. |
| 2013/0187203 A1 | 7/2013 | Xie et al. |
| 2013/0320412 A1 | 12/2013 | Yamasaki |
| 2014/0070292 A1* | 3/2014 | Cheng ................... H01L 21/84 257/301 |
| 2014/0103403 A1 | 4/2014 | Kim et al. |
| 2014/0103404 A1 | 4/2014 | Li et al. |
| 2014/0291750 A1* | 10/2014 | Khare .................. H01L 29/792 257/324 |
| 2014/0353718 A1* | 12/2014 | Loubet ................. H01L 27/092 257/192 |
| 2014/0374831 A1* | 12/2014 | Liaw ................... H01L 27/1104 257/368 |
| 2015/0014780 A1* | 1/2015 | Kim .................... H01L 27/0924 257/369 |
| 2015/0118836 A1 | 4/2015 | Lin et al. |
| 2015/0137273 A1 | 5/2015 | Zhang et al. |
| 2015/0270176 A1 | 9/2015 | Xie et al. |
| 2015/0311124 A1* | 10/2015 | Basker ............ H01L 21/823821 257/369 |
| 2015/0357409 A1 | 12/2015 | Horak et al. |
| 2016/0133726 A1* | 5/2016 | Sung ................ H01L 29/66795 438/283 |

OTHER PUBLICATIONS

IBM: List of IBM Patents or Patent Applications Treated as Related (Appendix P), Dated Sep. 23, 2016, 2 pages.

U.S. Appl. No. 14/945,497, filed Nov. 19, 2015, entitled: "Hybrid Logic and SRAM Contacts", 39 pages.

* cited by examiner

HYBRID LOGIC AND SRAM CONTACTS

BACKGROUND

The present invention generally relates to semiconductor manufacturing, and more particularly to fabricating electrically insulated contacts of a logic device and a strapped contact of a static random access memory (hereinafter "SRAM") device in the same process flow.

Complementary Metal-oxide-semiconductor (CMOS) technology is commonly used for fabricating field effect transistors (FET) as part of advanced integrated circuits (IC), such as central processing units (hereinafter "CPUs"), memory, storage devices, and the like. Different CMOS devices may be fabricated with different contact arrangements based on their intended use and function. For example, an SRAM device may be fabricated with a strapped contact in which an electrically conductive bridge is formed between a source/drain contact and a gate contact. Conversely, a logic device may be fabricated with source/drain contacts which are electrically insulated from a gate contact.

SUMMARY

According to an embodiment of the present invention, a method is provided. The method may include forming a first opening in a dielectric layer which exposes a source drain region of an SRAM device and forming a second opening in the dielectric layer which exposes a source drain region of a logic device, forming a third opening in the dielectric layer which exposes a gate of the SRAM device and forming a fourth opening in the dielectric layer which exposes a gate of the logic device, forming a first sidewall spacer in the third opening and forming a second sidewall spacer in the fourth opening, recessing a portion of the first sidewall spacer without recessing the second sidewall spacer, forming a strapped contact in the first and third openings, the strapped contact creates an electrical connection between the source drain region of the SRAM device and the gate of the SRAM device, the electrical connection is directly above a remaining portion of the first sidewall spacer, and forming contacts in the second and fourth openings, the second sidewall spacer electrically isolates the contact of the second opening from the contact of the fourth opening.

According to another embodiment, a method is provided. The method may include forming a first opening in a dielectric layer which exposes a source drain region of an SRAM device and forming a second opening in the dielectric layer which exposes a source drain region of a logic device, forming a first contact in the first opening and forming a second contact in the second opening, forming a third opening in the dielectric layer which exposes a gate of the SRAM device and a sidewall of the first contact, and forming a fourth opening in the dielectric layer which exposes a gate of the logic device, forming a first sidewall spacer in the third opening and forming a second sidewall spacer in the fourth opening, the first sidewall spacer being in direct contact with the sidewall of the first contact, recessing a portion of the first sidewall spacer to expose the sidewall of the first contact, without recessing the second sidewall spacer, forming a third contact in the third opening, abutting the sidewall of the first contact, such that the source drain region of the SRAM device is in electrical contact with the gate of the SRAM device, and forming a fourth contact in the fourth opening, the second sidewall spacer electrically isolates the second contact from the fourth contact.

According to another embodiment, a structure is provided. The structure may include a logic device including a first contact and a second contact, the first contact is above and in electrical contact with a gate of the logic device, the second contact is above and in electrical contact with a source drain of the logic device, the first contact is electrically isolated form the second contact by a sidewall spacer above the gate, and a static random access memory (SRAM) device including a third contact and a fourth contact, the third contact is above and in electrical contact with a gate of the SRAM device, the fourth contact is above and in electrical contact with a source drain of the SRAM device, a portion of a sidewall of the third contact is in direct contact with a portion of a sidewall of the fourth contact such that the gate and the source drain, both of the SRAM device, are electrically connected.

BRIEF DESCRIPTION OF THE DRAWINGS

The following detailed description, given by way of example and not intended to limit the invention solely thereto, will best be appreciated in conjunction with the accompanying drawings, in which.

Figure 1:
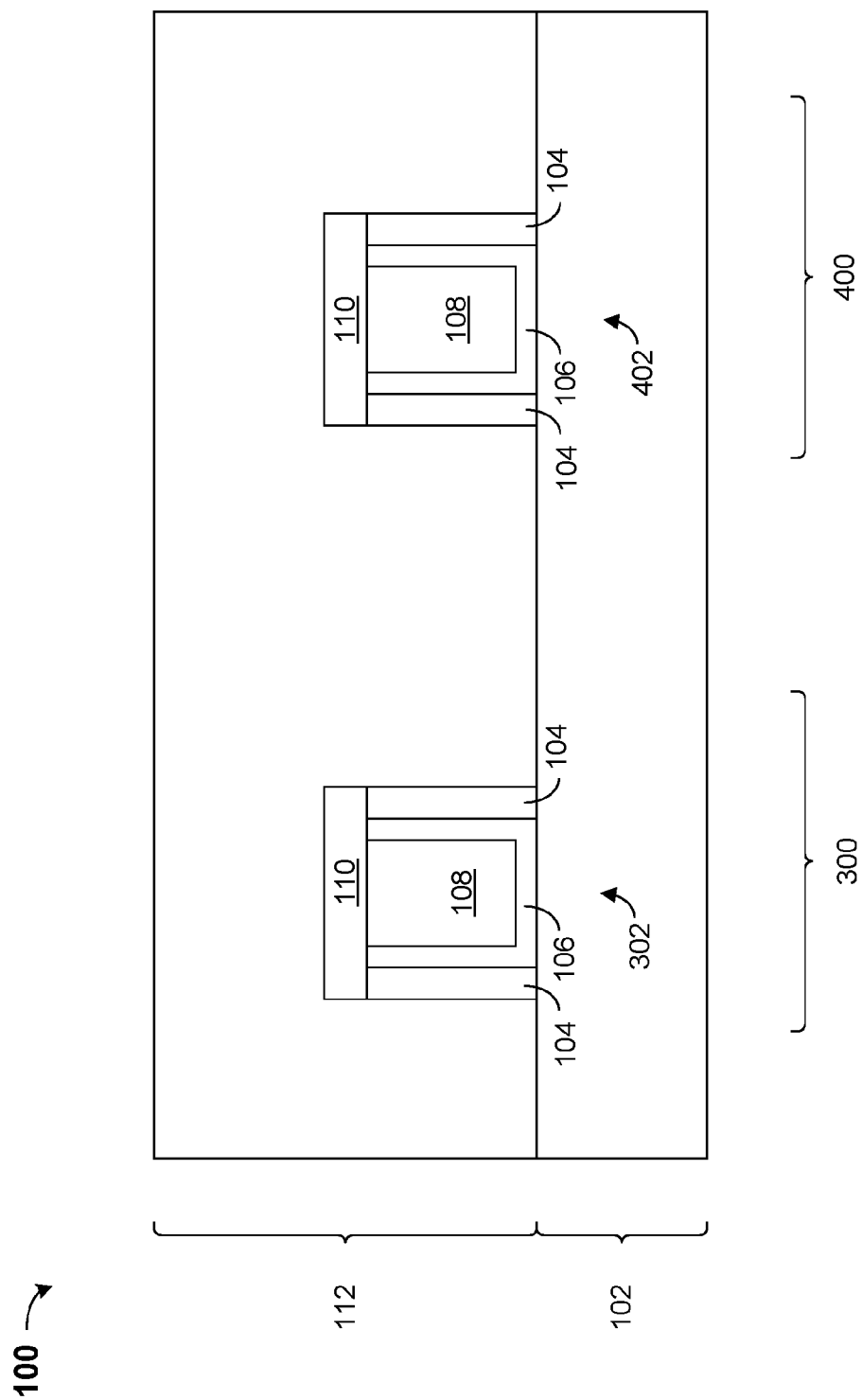
FIG. 1 is a cross-sectional view of a semiconductor structure at an intermediate stage of fabrication, according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor manufacturing, and more particularly to fabricating electrically insulated contacts of a logic device and a strapped contact of a static random access memory (hereinafter "SRAM") device in the same process flow. One way to fabricate both the electrically insulated contacts and the strapped contact may include fabricating and manipulating a pair of sidewall spacers when forming the gate contacts of both the SRAM device and the logic device. One method of fabricating and manipulating the pair of sidewall spacers to produce the electrically insulated contacts of the logic device and the strapped contact of the SRAM device is described in detail below by referring to the accompanying drawings in FIGS. 1-15, in accordance with an illustrative embodiment.

Referring now to FIG. 1, a semiconductor structure 100 (hereinafter "structure") is shown according to an exemplary embodiment. In general, the structure 100 may include a dielectric layer 112 formed on top of a substrate 102. Also, the structure 100 may be described as including an SRAM device region 300 and a logic device region 400. The dielectric layer 112 may also be referred to as a middle-of-line (hereinafter "MOL") dielectric.

The structure 100 of FIG. 1 may be formed or provided. At this step of the manufacturing process, the beginning structures of an SRAM device 302 and a logic device 402 are shown. The SRAM device 302 and the logic device 402 may preferably be fabricated in the SRAM device region 300 and the logic device region 400, respectively. At this step of the manufacturing process both the SRAM device 302 and the logic device 402 may include sidewall spacers 104, a gate dielectric layer 106, a gate electrode or a gate 108, and a gate cap 110. The SRAM device 302 and the logic device 402 may be formed on the substrate 102 as shown in FIG. 1 according to techniques known in the art.

The SRAM device 302 and the logic device 402 may be fabricated using either a replacement gate or gate last process flow, or a gate first process flow. A replacement gate process flow will be relied on for the description provided below.

In a replacement gate (RG) fabrication approach, the semiconductor substrate 102 may be patterned and etched to form active device region (e.g., fins). Next, one or more dummy gates may be formed in a direction perpendicular to the length of the fins. For example, the dummy gates may be pattered and etched from a polysilicon layer. A pair of sidewall spacers, for example, the sidewall spacers 104, can be disposed on opposite sidewalls of the dummy gates. The dummy gates and the pair of sidewall spacers may then be surrounded by an inter-level dielectric. Later, the dummy gates may be removed from between the pair of device spacers, as by, for example, an anisotropic vertical etch process such as a reactive ion etch (RIE). This creates an opening between the pair of device spacers where a metal gate, for example, the gate 108, may then be formed between the pair of device spacers. Optionally, a gate dielectric, for example, the gate dielectric layer 106, may be configured below the metal gate.

The substrate 102 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 102 may be, for example, a layered semiconductor such as Si/SiGe, a silicon-on-insulator, or a SiGe-on-insulator, where a buried insulator layer separates a base substrate from a top semiconductor layer. In such cases, components of the structure 100 may be formed in or from the top semiconductor layer of the SOI substrate. Typically the substrate 102 may be approximately, but is not limited to, several hundred microns thick.

In an embodiment, the SRAM device 302 and the logic device 402 may be fabricated as FinFET devices, nanowire devices, planar MOSFETs, or any suitable combination of those devices. In general, a FinFET device may include a plurality of fins formed in the substrate 102. In the present embodiment, the gates 108, of both the SRAM device 302 and the logic device 402 may each be perpendicular to and cover a portion of one or more fins. The portion of the fin covered by the gates 108 may serve as a channel region of each device (302, 402). Portions of the fin extending out from under each of the gates 108 may serve as source and drain regions for each device (302, 402). In this example, the FinFET may be formed from the semiconductor substrate 102 using known photolithography and etch processes. It should be noted that the gate dielectric layer 106 may, in most cases, separate the gate 108 from the channel regions in the fin. It should also be noted, that in the context of FinFET devices the portion of the substrate 102 illustrated in the figures represents a cross-section view of a fin and the gate dielectric layer 106 and the gate 108 are illustrated as being disposed directly on top of the fin, according to the present embodiment.

The dielectric layer 112 may be formed directly on the exposed top surfaces of the structure 100, according to an exemplary embodiment. The dielectric layer 112 may be made from an insulator material such as an oxide, nitride, oxynitride, silicon carbon oxynitride, silicon boron oxynitride, low-k dielectric, or any combination thereof. The dielectric layer 112 may be deposited using typical deposition techniques, for example, atomic layer deposition (ALD), molecular layer deposition (MLD), chemical vapor deposition (CVD), physical vapor deposition (PVD), and spin on techniques. In an embodiment, the dielectric layer 112 may include one or more layers. In an embodiment, the dielectric layer 112 may have a vertical thickness, or height, ranging from about 20 nm to 200 nm, and ranges there between, although a thickness less than 20 nm and greater than 200 nm may be acceptable.

The gate dielectric layer 106 may be formed using typical deposition techniques, for example, atomic layer deposition (ALD), molecular layer deposition (MLD), chemical vapor deposition (CVD), physical vapor deposition (PVD), or any suitable combination of those techniques. The material of the gate dielectric 106 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In an embodiment, the gate dielectric layer 106 may include hafnium oxide deposited using a chemical vapor deposition technique.

The gate 108 may be formed using known techniques. The material of the gate 108 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

In an embodiment, the gate cap 110 may be fabricated atop the gate 108, an exposed edge of the gate dielectric layer 106 and an exposed edge of the sidewall spacers 104. The gate cap 110 may include any dielectric material known in the art, for example, a nitride. The gate cap 110 may be deposited using typical deposition techniques, for example, atomic layer deposition (ALD), molecular layer deposition (MLD), chemical vapor deposition (CVD), physical vapor deposition (PVD), and spin on techniques. The gate cap 110 may include silicon nitride deposited using a chemical vapor deposition technique. The gate cap 110 may have a thickness ranging from about 5 nm to about 30 nm and ranges there between, although a thickness less than 5 nm and greater than 30 nm may be acceptable. Preferably, the gate cap 110 is provided to protect the gate 108, the exposed edge of the gate dielectric layer 106 and the exposed edge of the sidewall spacers 104 during subsequent processing. As such, the gate cap 110 may typically be composed of a material which has a different etch rate than the dielectric layer 112. More specifically, the dielectric layer 112 may preferably be composed of a material which may be etched and removed selective to the gate cap 110. Furthermore, the gate cap 110 may function as an etch stop during subsequent processing techniques.

It should be noted that the area of the substrate 102, or fin, covered by the gate 108 may generally be referred to as a gate electrode, and the areas of the substrate 102, or fin, not covered by the gate 108 may generally be referred to as a source drain region. It should be noted that any number of gates 108 may be formed on the structure 100.

Figure 2:
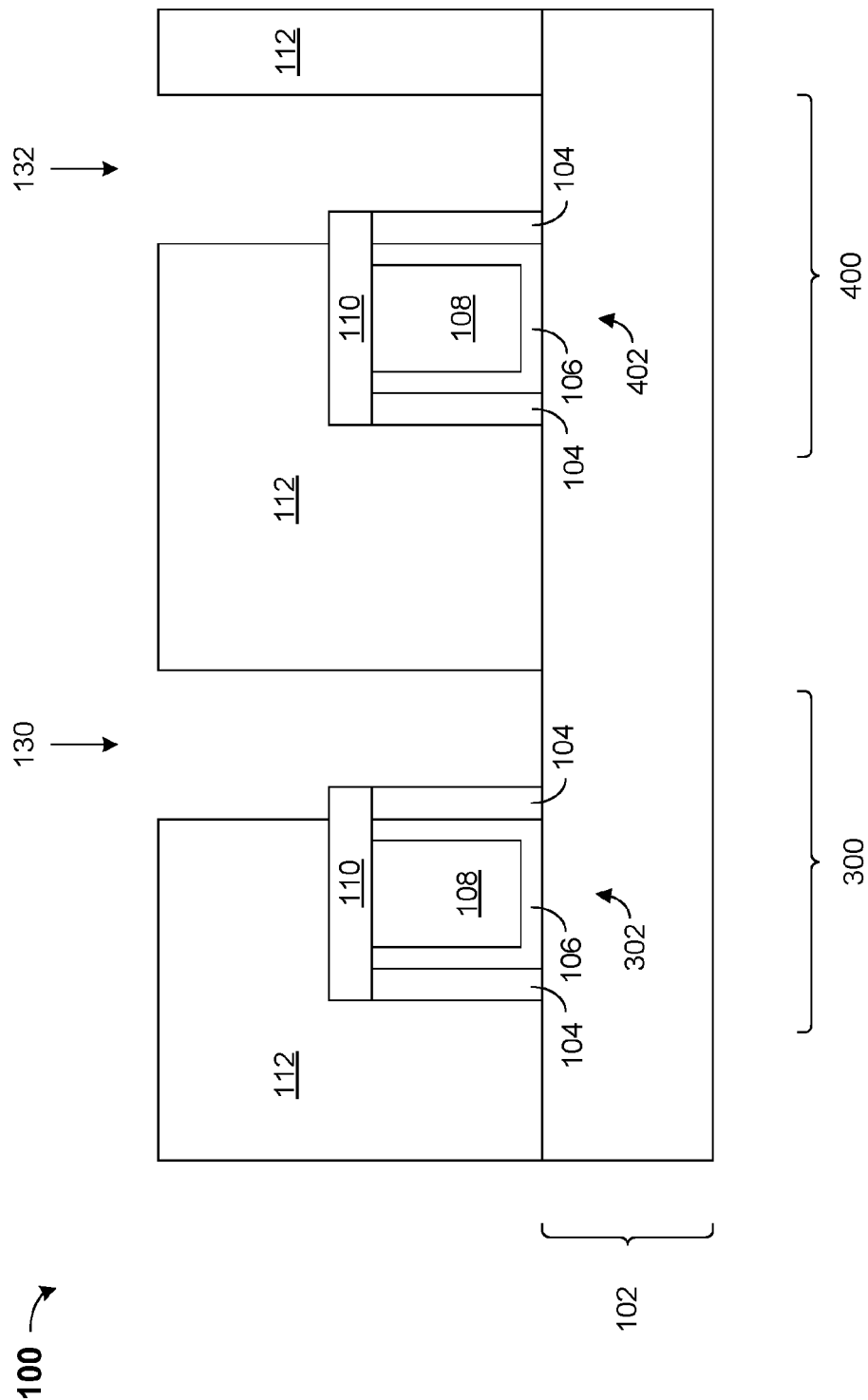
FIG. 2 is a cross-sectional view of the semiconductor structure and illustrates forming a first opening and a second opening, according to an exemplary embodiment.

Referring now to FIG. 2, a first opening 130 and a second opening 132 may be formed using standard patterning, lithography and etch techniques. The first opening 130 may be located in the SRAM device region 300 and is generally aligned with the SRAM device 302, and the second opening 132 may be located in the logic device region 400 and is generally aligned with the logic device 402. Stated differently, the first opening 130 may be self-aligned to the sidewall spacer 104 and gate cap 110 of the SRAM device and the second opening 132 may be self-aligned to the sidewall spacer 104 and the gate cap 110 of the logic device. The first and second openings 130, 132 may each be a self-aligned contact, where the gate cap 110 and the sidewall spacer 104 border a side of the first and second openings 130, 132, and may form an etch stop during the standard patterning, lithography and etch techniques. The substrate 102 may preferably be exposed at a bottom of both the first opening 130 and the second opening 132. More specifically, the first opening 130 and the second opening 132 may preferably expose the source drain region of the SRAM device 302 and the logic device 402, respectively.

Due to dimensional constraints and motivations to conserve valuable area, the first and second openings 130, 132, may coincide with or intersect the SRAM device 302 and the logic device 402, respectively, as illustrated. The first and the second openings 130, 132, may expose a source drain region of the SRAM device 302, and a source drain region of the logic device 402, respectively. The first and the second openings 130, 132, may extend over a top portion of the gate cap 110, and may expose a sidewall of the sidewall spacer 104 of the SRAM device 302 and the logic device 402, respectively. A bottom of the first opening 130 and a bottom of the second opening 132 may range from about 10 nm to about 100 nm wide, and ranges there between, although a width less than 10 nm and greater than 100 nm may be acceptable. A top of the first opening 130 and a top of the second opening 132 may range from about 10 nm to about 30 nm wider than the bottoms of the first opening 130 and the second opening, respectively.

It should be noted that in forming the first opening 130 and the second opening 132, portions of the dielectric layer 112 may be removed selective to both the sidewall spacers 104 and the gate cap 110. Likewise, the sidewall spacers 104 and the gate cap 110 may serve to protect the gate 108 during etching of the first and second openings 130, 132.

Figure 3:
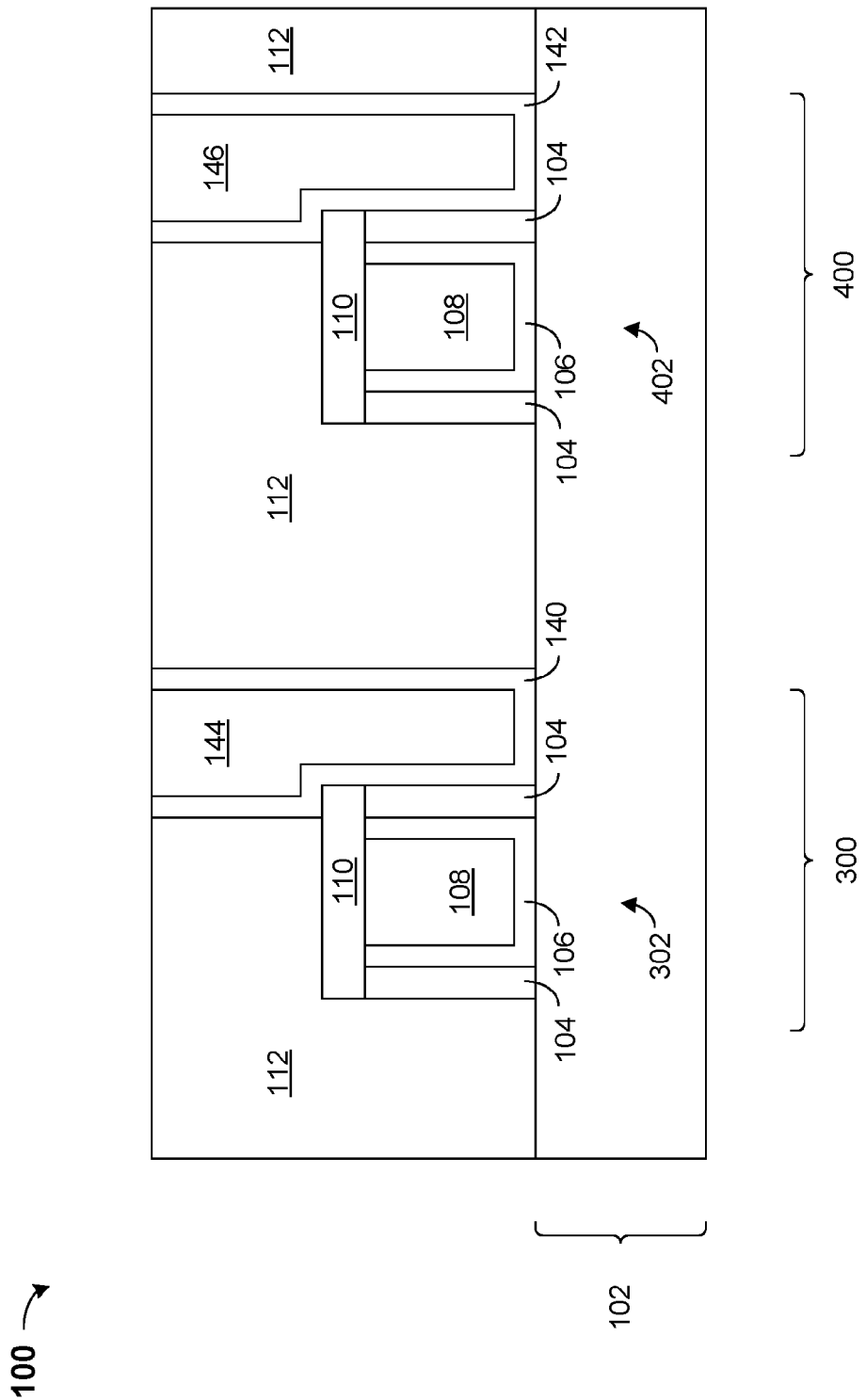
FIG. 3 is a cross-sectional view of the semiconductor structure and illustrates filling the first opening and the second opening, according to an exemplary embodiment.

Referring now to FIG. 3, a first opening liner 140 and a first contact 144 may be formed in the first opening 130, and a second opening liner 142 and a second contact 146 may be formed in the second opening 132. The first opening liner 140 and the second opening liner 142 may be first deposited using typical deposition techniques, for example, atomic layer deposition (ALD), molecular layer deposition (MLD), chemical vapor deposition (CVD), physical vapor deposition (PVD), and spin on techniques. In an embodiment, the first opening liner 140 and the second opening liner 142 may include titanium nitride (TiN) deposited using a chemical vapor deposition technique. In an embodiment, the first opening liner 140 and the second opening liner 142 may have a thickness ranging from about 2 nm to about 5 nm and ranges there between, although a thickness less than 2 nm and greater than 5 nm may be acceptable.

The first contact 144 and the second contact 146 may be a conducting material, such as metal. For example, the first contact 144 and the second contact 146 may be tungsten (W), copper (Cu), or cobalt (Co) and may be deposited using typical deposition techniques, for example, atomic layer deposition (ALD), molecular layer deposition (MLD), chemical vapor deposition (CVD), physical vapor deposition (PVD), and spin on techniques. The first opening liner 140, the second opening liner 142, the first contact 144 and the second contact 146 may be polished using a chemical mechanical polishing (CMP) technique until a top surface of each of the first opening liner 140, the second opening liner 142, the first contact 144 and the second contact 146 is substantially coplanar with a top surface of the dielectric layer 112, as illustrated. Stated differently, top surfaces of each of the first opening liner 140, the second opening liner 142, the first contact 144 and the second contact 146 are substantially flush with a top surface of the dielectric layer 112.

Figure 4:
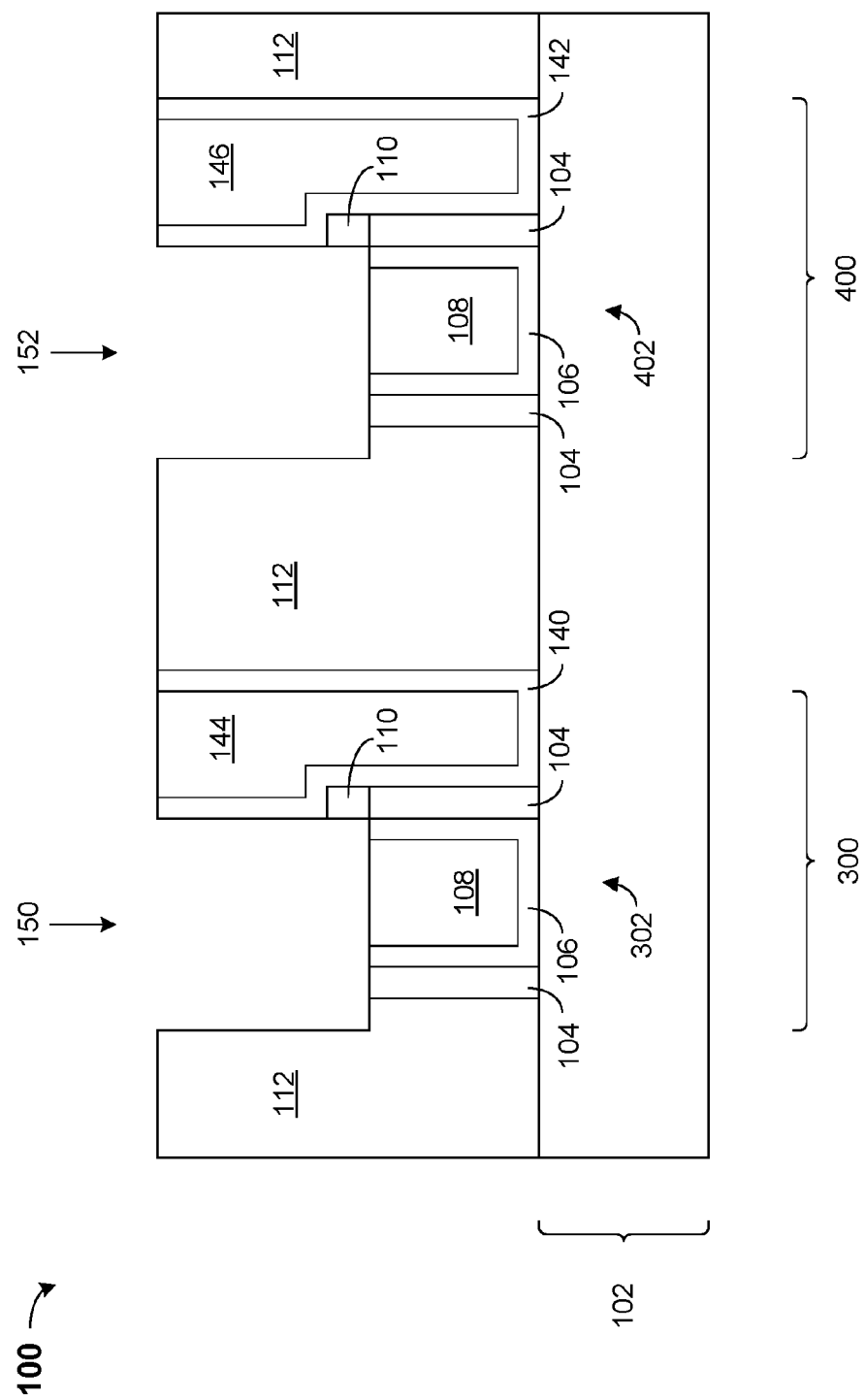
FIG. 4 is a cross-sectional view of the semiconductor structure and illustrates forming a third opening and a fourth opening, according to an exemplary embodiment.

Referring now to FIG. 4, a third opening 150 and a fourth opening 152 may be formed using standard patterning, lithography and etch techniques. The third opening 150 may be located in the SRAM device region 300 and is generally aligned with the SRAM device 302. The fourth opening 152 may be located in the logic device region 400 and is generally aligned with the logic device 402. The third and fourth openings 150, 152, may each be a self-aligned contact, where the first and second openings liner 140, 142, border a portion of a side of the third and fourth openings 150, 152, and may form an etch stop during the standard patterning, lithography and etch techniques. A portion of the gate cap 110 may be removed in the SRAM device and in the logic device 402, exposing a top surface of the gate 108, an exposed top surface of the gate dielectric layer 106 and an exposed top surface of the sidewall spacer 104, of the SRAM device 302 and the logic device 402, respectively. A portion of the gate cap 110 of the SRAM device 302 and the logic device 402 may remain, as illustrated. The third and fourth openings 150, 152, may expose a sidewall portion of the first opening liner 140 and the second opening liner 142 of the SRAM device 302 and the logic device 402, respectively.

Figure 5:
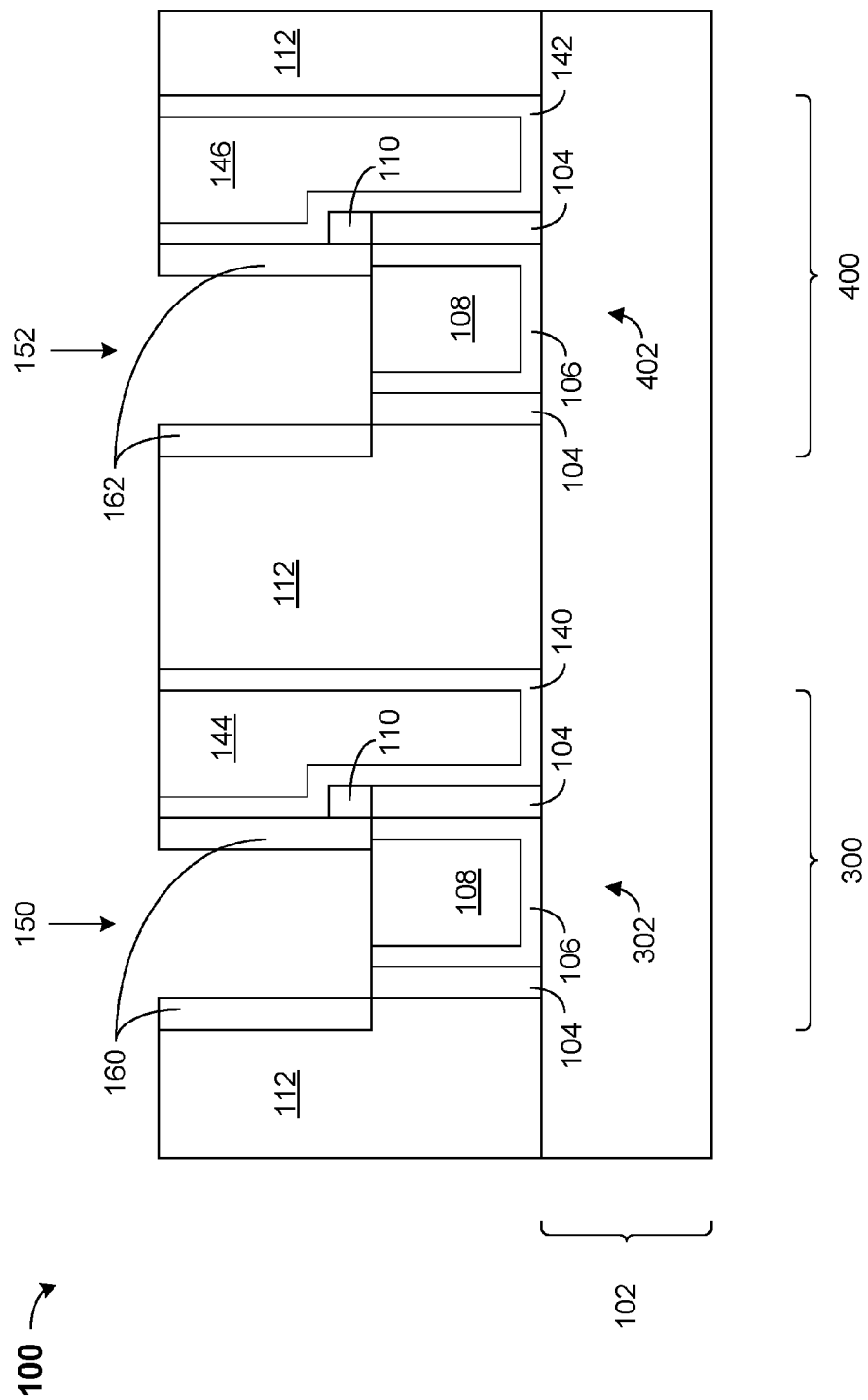
FIG. 5 is a cross-sectional view of the semiconductor structure and illustrates forming a pair of sidewall spacers within the third opening and forming a pair of sidewall spacers within the fourth opening, according to an exemplary embodiment.

Referring now to FIG. 5, a first pair of sidewall spacers 160 may be formed within the third opening 150, and a second pair of sidewall spacers 162 may be formed within the fourth opening 152. In general, the first and second pairs of sidewall spacers 160, 162, may be formed on opposite sidewalls of the third and fourth openings 150, 152, respectively. The first and second pairs of sidewall spacers 160, 162 may be formed by conformally depositing or growing a dielectric, followed by an anisotropic etch that removes the dielectric from the horizontal surfaces of the structure 100, while leaving it on the sidewalls of the third and fourth openings 150, 152. In an embodiment, the first and second pairs of sidewall spacers 160, 162 may include any dielectric material such as silicon oxide, silicon oxynitride, silicon nitride, SiBCN, SiOC, low-k dielectric or any combination of these materials. The first and second pairs of sidewall spacers 160, 162, may include a single layer; however, the first and second pairs of sidewall spacers 160, 162, may include multiple layers of dielectric material. In an embodiment, the first and second pairs of sidewall spacers 160, 162, may be silicon nitride. In an embodiment, the first and second pairs of sidewall spacers 160, 162, may have a lateral thickness ranging from about 3 nm to about 20 nm, and ranges there between, although a thickness less than 3 nm and greater than 20 nm may be acceptable. The first and second pairs of sidewall spacers 160, 162 may serve to insulate the gate from the source drain region.

Figure 6:
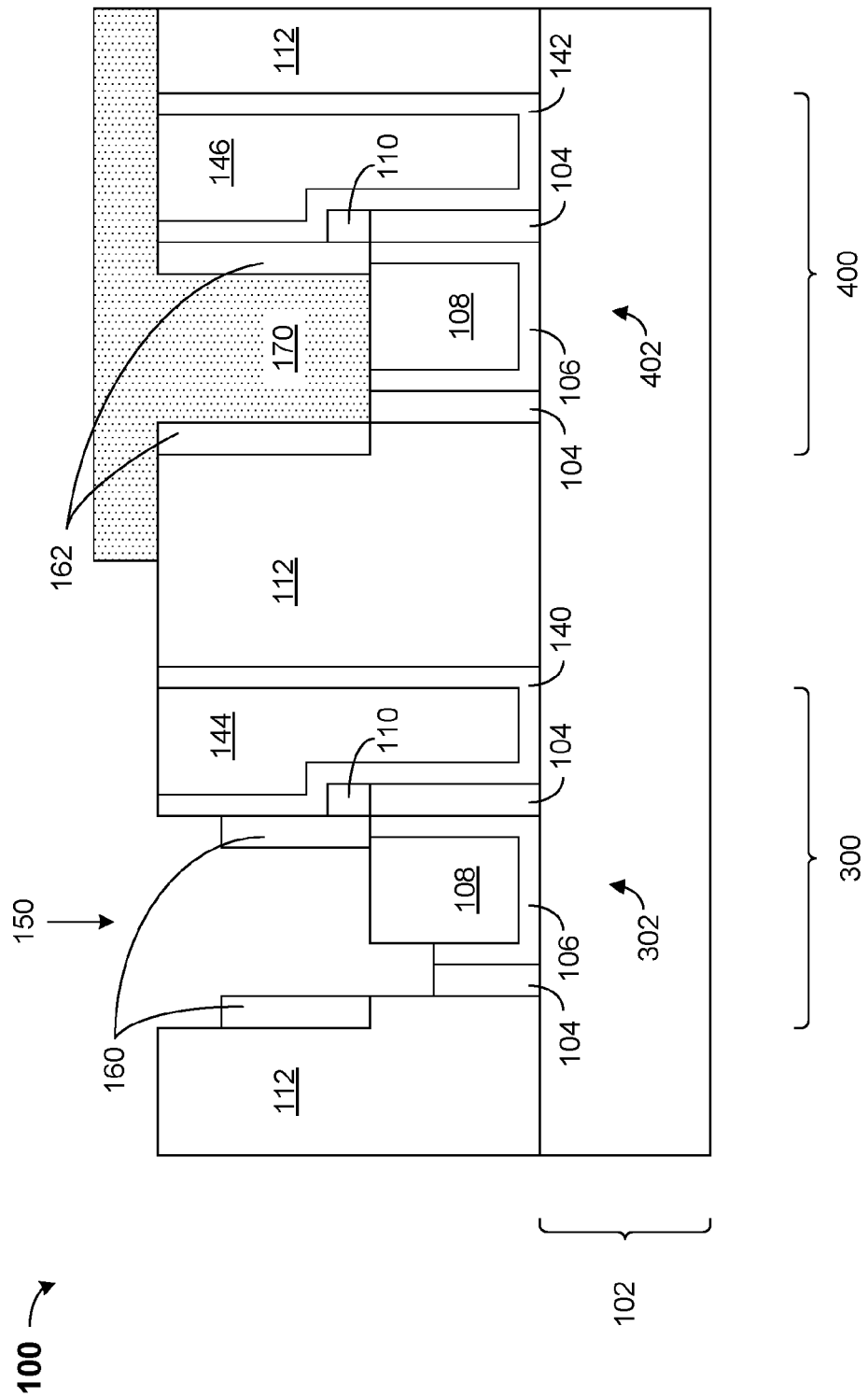
FIG. 6 is a cross-sectional view of the semiconductor structure and illustrates recessing the pair of sidewall spacers in the third opening without recessing the pair of sidewall spacers in the fourth opening, according to an exemplary embodiment.

Referring now to FIG. 6, the first pair of sidewall spacers 160 may be recessed while protecting the logic device 402 and the second pair of sidewall spacers 162 using a mask 170. First, the mask 170 may be formed in the logic device region 400 to cover and protect the second pair of sidewall spacers 162. The mask 170 may be a hardmask formed using known photolithography and etch processes. The mask 170 may directly cover the logic device 402 in the logic device region 400. The SRAM device region 300 may not be covered by the mask 170. A directional etch, for example an anisotropic vertical etch process such as a reactive ion etch (RIE), may be performed in the SRAM device region 300, and may remove an upper portion of the first pair of sidewall spacers 160 on both a first side of the third opening 150 and a second side of the third opening 150. In a preferred embodiment, a portion of the sidewall spacer 104 and a portion of the gate dielectric layer 106, both in the SRAM device 302, may be removed, exposing a portion of a sidewall of the gate 108 of the SRAM device 302.

Figure 7:
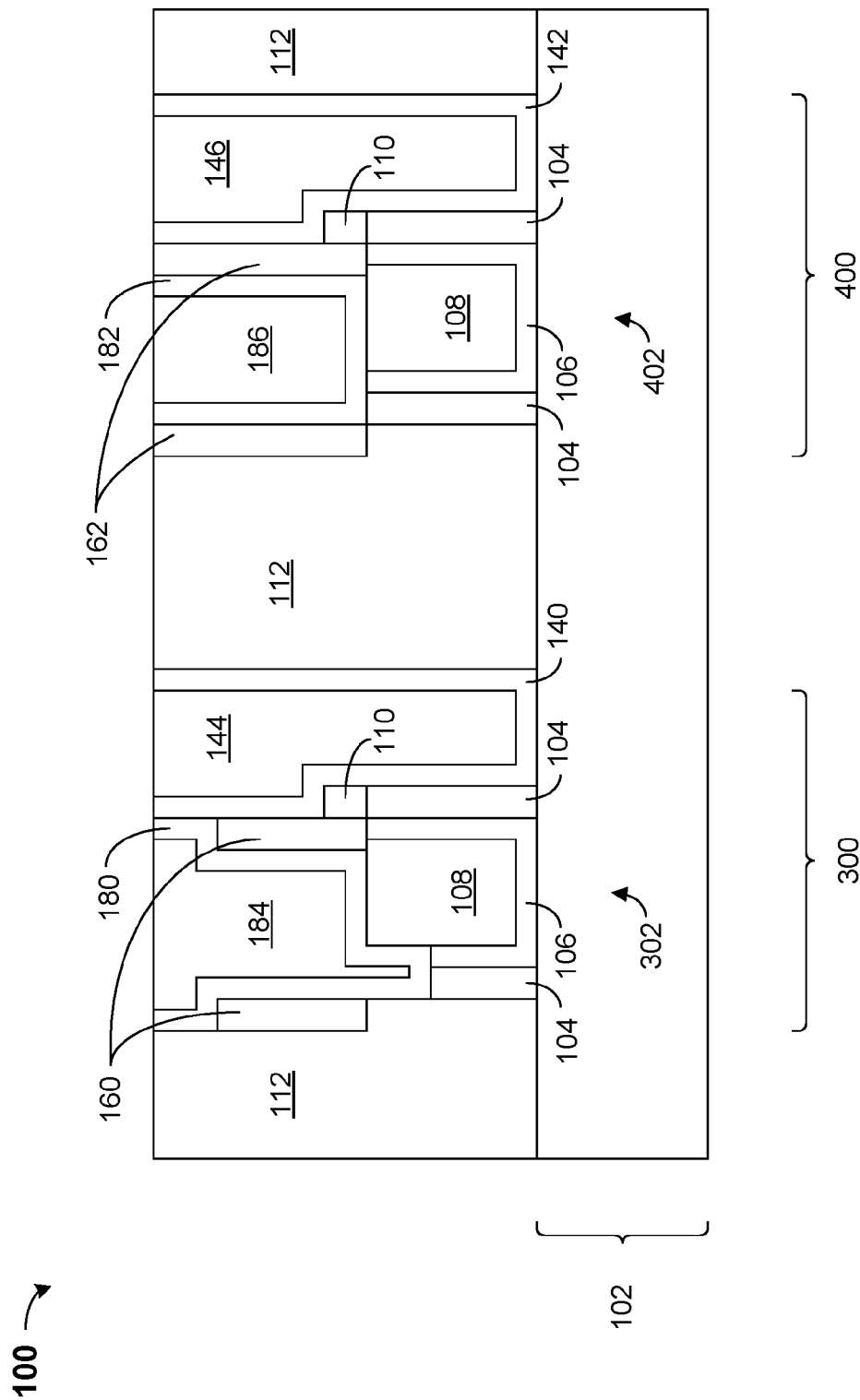
FIG. 7 is a cross-sectional view of the semiconductor structure and illustrates forming a gate contact structures in the third opening and in the fourth opening according to an exemplary embodiment.

Referring now to FIG. 7, the mask 170 may be removed. The mask 170 may be removed by known etch processes. As shown in the figure, a third opening liner 180, a fourth opening liner 182, a third contact 184 and a fourth contact 186 may be formed. The third and fourth opening liners 180, 182, may be deposited using typical deposition techniques, for example, atomic layer deposition (ALD), molecular layer deposition (MLD), chemical vapor deposition (CVD), physical vapor deposition (PVD), and spin on techniques, followed by a directional etch, for example an anisotropic vertical etch process such as a reactive ion etch (RIE). In an embodiment, the third and fourth opening liners 180, 182, may include titanium nitride (TiN) deposited using a chemical vapor deposition technique. In an embodiment, the third and fourth opening liners 180, 182, may include one or more layers. The third and fourth opening liners 180, 182, may be conformally formed on exposed surfaces of the third and fourth openings 150, 152, respectively. In an embodiment, the third and fourth opening liners 180, 182, may have a thickness, about 3 nm to 20 nm, and ranges there between, although a thickness less than 3 nm and greater than 20 nm may be acceptable.

The third and fourth contacts 184, 186, may be a conducting material, such as a metal. In an embodiment, the third and fourth contacts 184, 186, may be tungsten (W), copper (Cu), or cobalt (Co), and may be deposited using typical deposition techniques, for example, atomic layer deposition (ALD), molecular layer deposition (MLD), chemical vapor deposition (CVD), physical vapor deposition (PVD), and spin on techniques. The third and fourth opening liners 180, 182, and the third and fourth contacts 184, 186, may be polished using a chemical mechanical polishing (CMP) technique until a top surface of third and fourth opening liners 180, 182, and the third and fourth contacts 184, 186, are substantially coplanar with a top surface of the dielectric layer 112, as illustrated. Stated differently, top surfaces of each of the third opening liner 180, the fourth opening liner 182, the third contact 184 and the fourth contact 186 are substantially flush with a top surface of the dielectric layer 112.

As illustrated, the first contact 144, the first opening liner 140, the third opening liner 180 and the third contact 184, are electrically connected and a conductive path exists between the gate 108 and the source/drain of the SRAM device 302. The conductive path between the gate 108 and the source/drain of the SRAM device 302 may be referred to as a strapped contact. The strapped contact creates an electrical connection between the source drain region of the SRAM device and the gate 108 of the SRAM device, the electrical connection is directly above a remaining portion of the first pair of sidewall spacers 160.

Together, the second contact 146 and the second opening liner 142, are separated from the fourth contact 186 and the fourth opening liner 182 by a portion of the second pair of sidewall spacers 162. This provides a non-conductive path between the gate 108 and source/drain of the logic device region 400. The gate 108 and the source/drain of the logic device 402 are electrically insulated. The first, second, third and fourth contacts 144, 146, 184, 186, may be within the MOL dielectric.

The previous descriptions refer to the fabrication of an SRAM and a logic device. The process as described can be used for any semiconductor fabrication which has devices which requires both connected gate and source drain regions, and non-connected gate and source drain regions.

Figure 8:
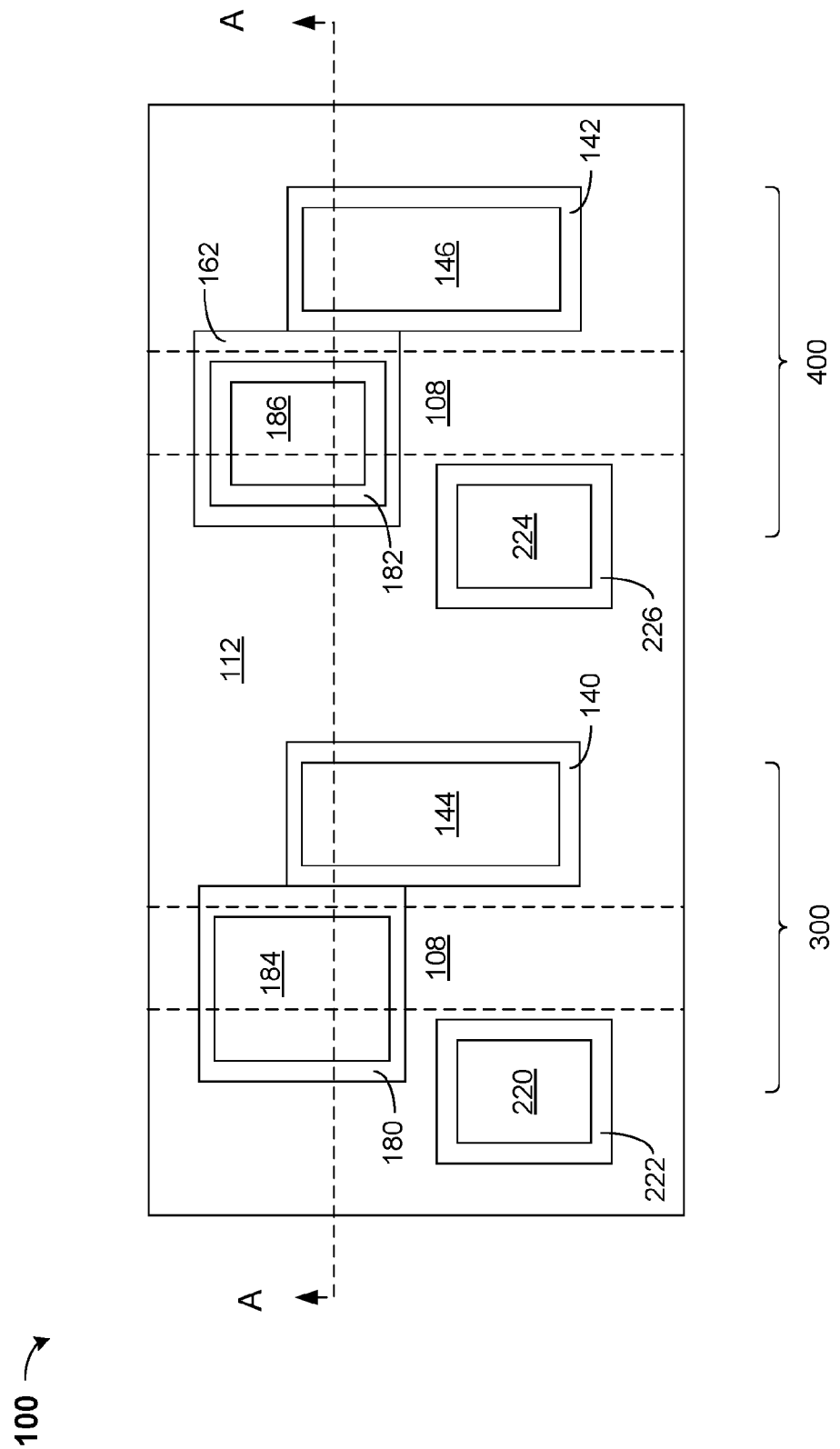
FIG. 8 is a top view of a semiconductor structure depicted in FIG. 7, according to an exemplary embodiment.

Referring now to FIG. 8, a top view of the structure 100 is shown. The line AA depicts a cross sectional line of the FIGS. 1 to 7. The gate 108 of both the SRAM device 302 and the logic device 402 is depicted with dashed lines for added clarity and understanding. The dielectric layer 112 may electrically insulate the contacts of the SRAM device 302 from the contacts of the logic device 402. The first contact 144 and the first opening liner 140 make up the contact for the source/drain of the SRAM device 302. The third contact 184 and the third opening liner 180 make up the contact for the gate 108 of the SRAM device 302. The first and third contacts 144, 184, and the first and third opening liners 140, 180, are all electrically connected. Thus, the gate 108 of the SRAM device 302 is electrically connected to the source/drain of the SRAM device 302. A fifth contact 220 and a fifth opening liner 222 make up another source drain contact for the SRAM device 302, which is electrically insulated from both the first contact 144 and the third contact 184.

The second contact 146 and the second opening liner 142 make up the contact for the source/drain of the logic device 402. The fourth contact 186 and the fourth opening liner 182 make up the contact for the gate 108 of the logic device 402. A sixth contact 224 and a sixth opening liner 226 make up a contact for another source/drain of the logic device 402. The contacts for the gate 108 and both source/drains of the logic device 402 are each electrically insulated from one another. Specifically, a portion of the sidewall spacer 162 electrically insulates the second contact 146 from the fourth contact 186.

Figure 9:
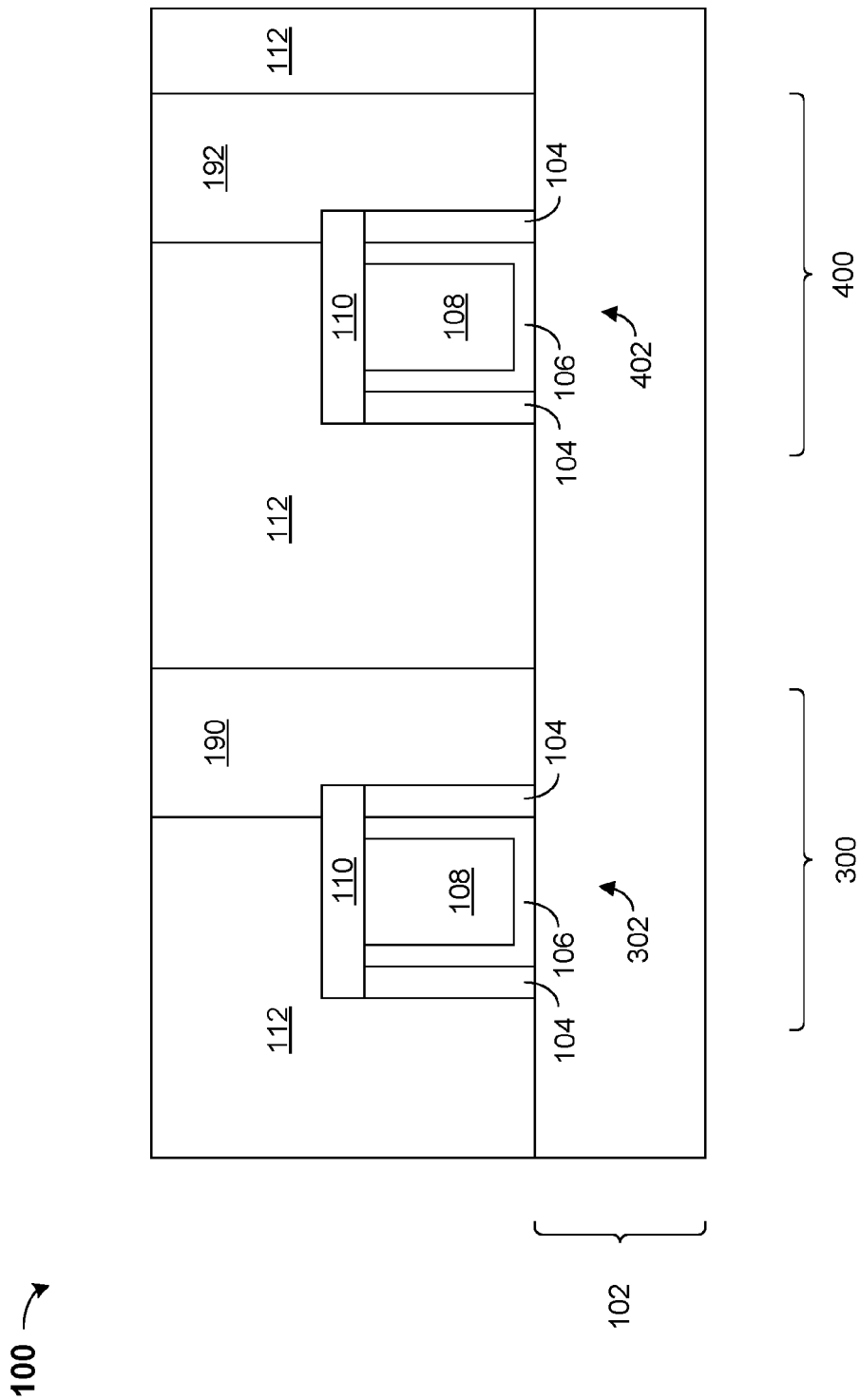
FIG. 9 is a cross-sectional view of the semiconductor structure at an intermediate stage of fabrication in which the first and second openings are filled with a sacrificial material, according to another exemplary embodiment.

An alternate embodiment of this invention follows FIGS. 1 to 2 and continues with FIG. 9. In this alternate embodiment, the first and second openings 130, 132 are filled with a sacrificial material which is later removed. The first, second, third and fourth openings, 130, 132, 150, 152, are later filled with a liner and a contact. The process steps are substantially similar to above, with like numbered objects the same as the above description.

Referring now to FIG. 9, a first sacrificial filler 190 and a second sacrificial filler 192 may be formed in the first opening 130 and the second opening 132, respectively. The first and second sacrificial fillers 190, 192, may include any suitable silicon or polysilicon able to be selectively removed relative to other materials used in this embodiment for an opening liner, a spacer, a gate cap, a dielectric, etc. In an embodiment, the first and second sacrificial fillers 190, 192, may include amorphous carbon. The first and second sacrificial fillers 190, 192, may be deposited using typical deposition techniques, for example, atomic layer deposition (ALD), molecular layer deposition (MLD), chemical vapor deposition (CVD), physical vapor deposition (PVD), and spin on techniques. In some embodiments, a thin layer of dummy oxide (not shown) may be deposited prior to depositing the first and second sacrificial fillers 190, 192. The first and second sacrificial fillers 190, 192, may be polished using a chemical mechanical polishing (CMP) technique until a top surface of the first and second sacrificial fillers 190, 192 is substantially coplanar with a top surface of the dielectric layer 112, as illustrated. Stated differently, top surfaces of each of the first and second sacrificial fillers 190, 192 are substantially flush with a top surface of the dielectric layer 112.

Figure 10:
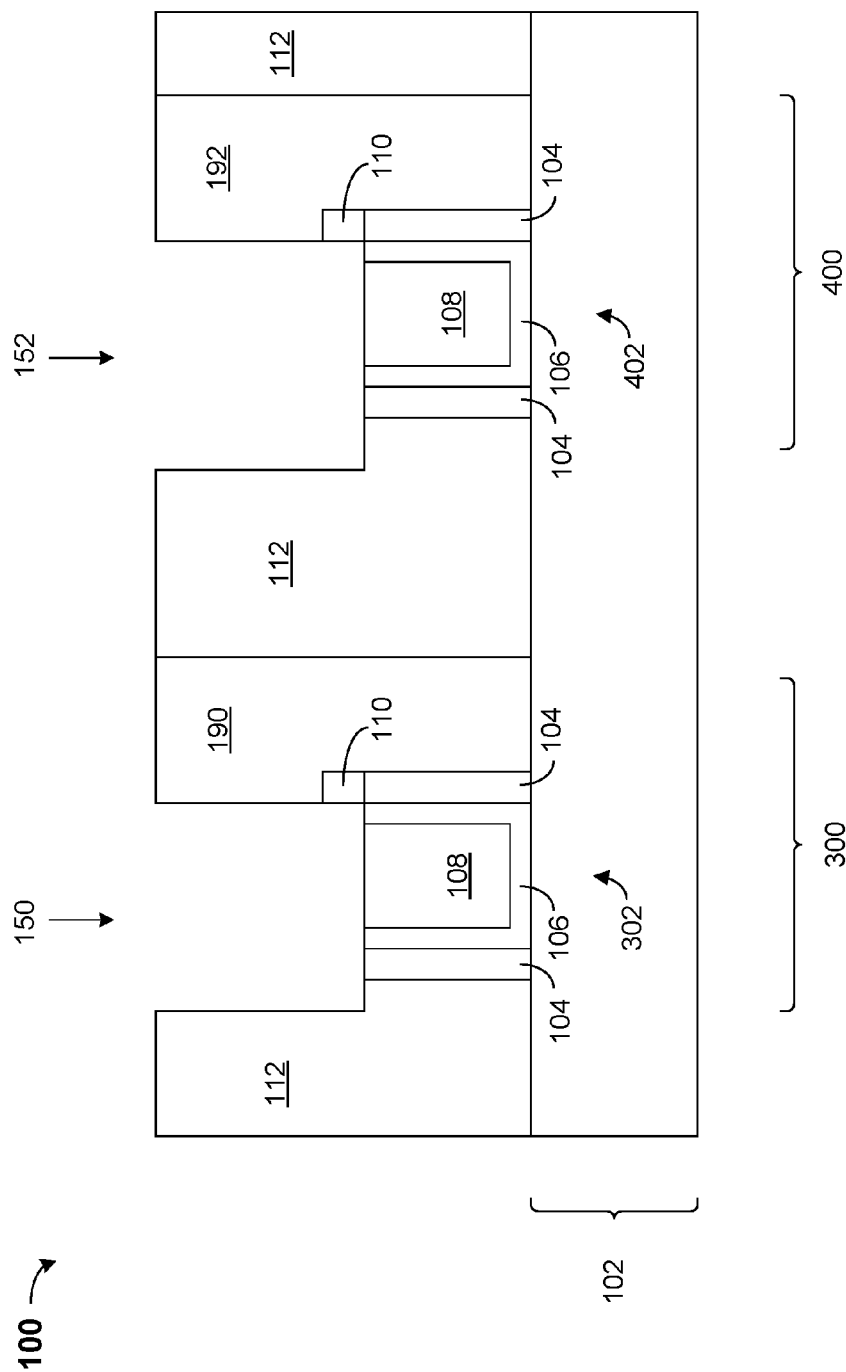
FIG. 10 is a cross-sectional view of the semiconductor structure and illustrates forming a third opening and a fourth opening, according to an exemplary embodiment.

Referring now to FIG. 10, a third opening 150 and a fourth opening 152 may be formed using standard patterning, lithography and etch techniques. The third opening 150 may be located in the SRAM device region 300 and is generally aligned with the SRAM device 302. The fourth opening 152 may be located in the logic device region 400 and is generally aligned with the logic device 402. A portion of the gate cap 110 may be removed in the SRAM device and in the logic device 402, exposing a top surface of the gate 108, an exposed top surface of the gate dielectric layer 106 and an exposed top surface of the sidewall spacer 104, of the SRAM device 302 and the logic device 402, respectively. A portion of the gate cap 110 of the SRAM device 302 and the logic device 402 may remain, as illustrated. The third and fourth openings 150, 152, may expose a sidewall portion of the first opening liner 140 and the second opening liner 142 of the SRAM device 302 and the logic device 402, respectively.

Figure 11:
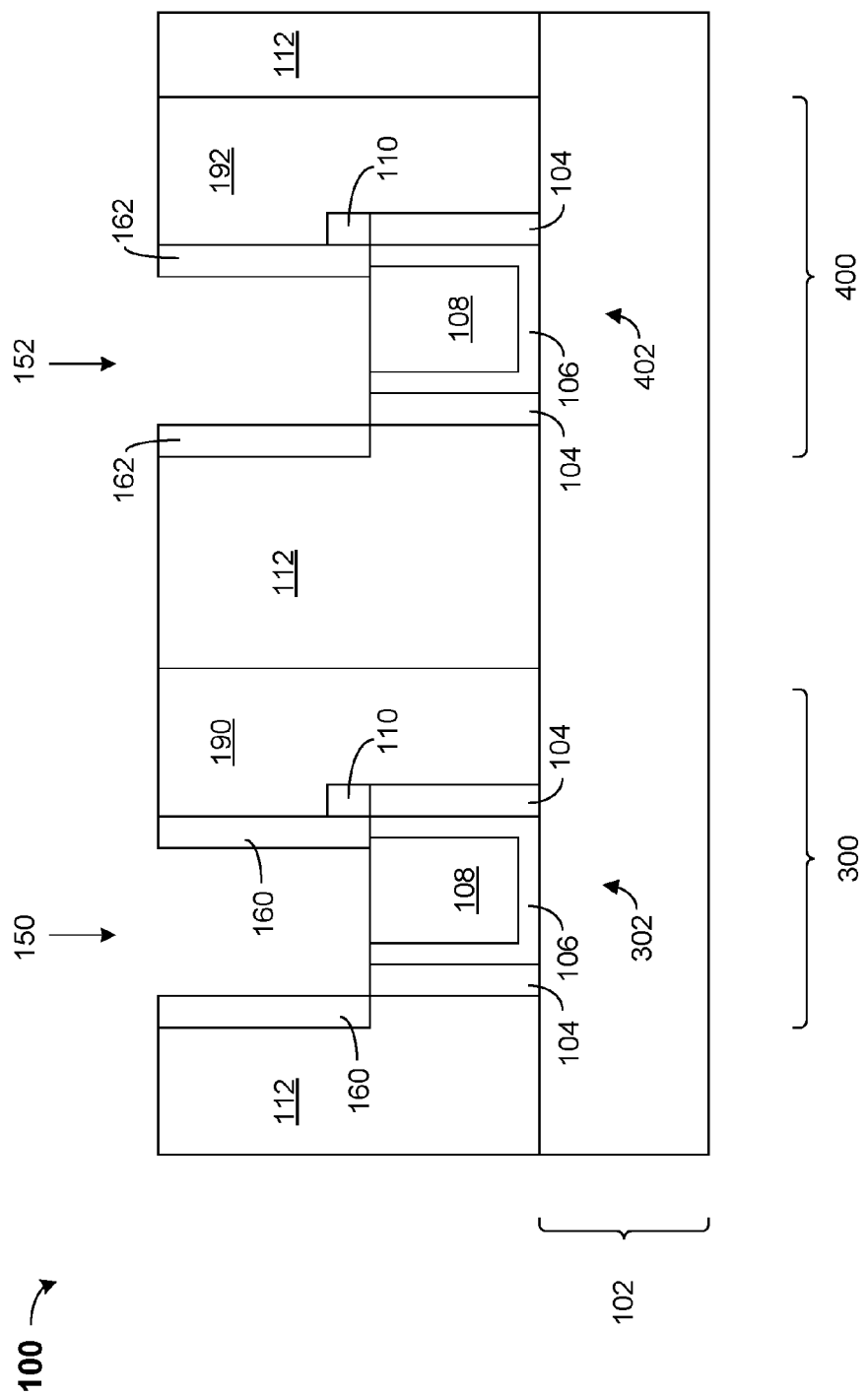
FIG. 11 is a cross-sectional view of the semiconductor structure and illustrates forming a pair of sidewall spacers within the third opening and forming a pair of sidewall spacers within the fourth opening, according to an exemplary embodiment.

Referring now to FIG. 11, a first pair of sidewall spacers 160 may be formed within the third opening 150, and a second pair of sidewall spacers 162 may be formed within the fourth opening 152. In general, the first and second pairs of sidewall spacers 160, 162, may be formed on opposite sidewalls of the third and fourth openings 150, 152, respectively. The first and second pairs of sidewall spacers 160, 162, may be formed by conformally depositing or growing a dielectric, followed by an anisotropic etch that removes the dielectric from the horizontal surfaces of the structure 100, while leaving it on the sidewalls of the third and fourth openings 150, 152. In an embodiment, the first and second pairs of sidewall spacers 160, 162, may include any dielectric material such as silicon nitride (Si3N4), SiBCN, SiOC, low-k dielectric or any combination of these materials. The first and second pairs of sidewall spacers 160, 162, may include a single layer; however, the first and second pairs of sidewall spacers 160, 162, may include multiple layers of dielectric material. In an embodiment, the first and second pairs of sidewall spacers 160, 162, may be silicon nitride (SiN). In an embodiment, the first and second pairs of sidewall spacers 160, 162, may have a lateral thickness ranging from about 3 nm to about 20 nm, and ranges there between, although a thickness less than 3 nm and greater than 20 nm may be acceptable. The first and second pairs of sidewall spacers 160, 162 may serve to insulate the gate from the source drain region.

Figure 12:
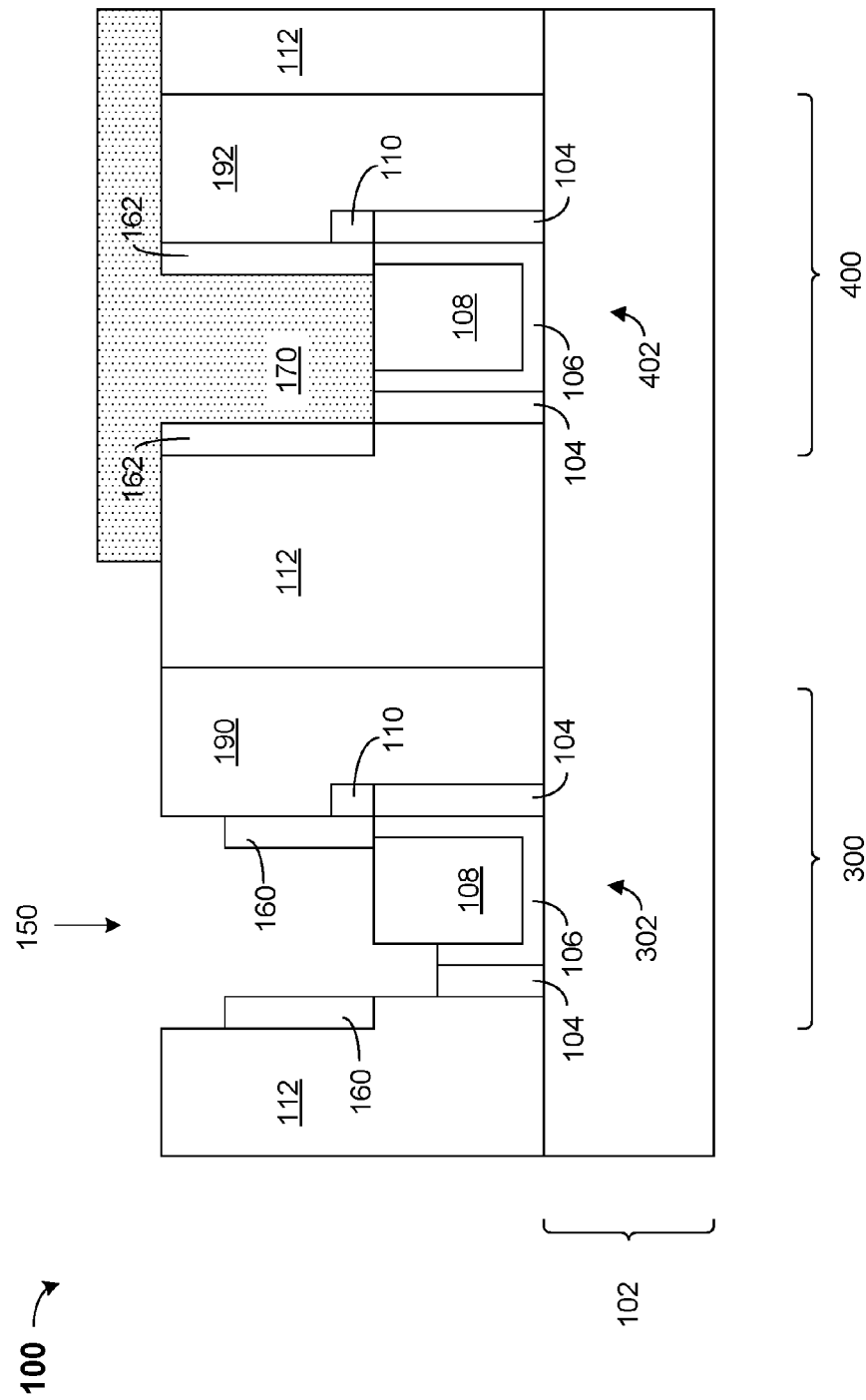
FIG. 12 is a cross-sectional view of the semiconductor structure and illustrates recessing the pair of sidewall spacers in the third opening without recessing the pair of sidewall spacers in the fourth opening, according to an exemplary embodiment.

Referring now to FIG. 12, the first pair of sidewall spacers 160 may be recessed while protecting the logic device 402 and the second pair of sidewall spacers 162 using a mask 170. First, the mask 170 may be formed in the logic device region 400 to cover and protect the second pair of sidewall spacers 162. The mask 170 may be a hardmask formed using known photolithography and etch processes. The mask 170 may directly cover the logic device region 400. The SRAM device region 300 may not be covered by the mask 170. A directional etch, for example an anisotropic vertical etch process such as a reactive ion etch (RIE), may be performed in the SRAM device region 300, and may remove an upper portion of the first pair of sidewall spacers 160 on both a first side of the third opening 150 and a second side of the third opening 150. In a preferred embodiment, a portion of the sidewall spacer 104 and a portion of the gate dielectric layer 106, both in the SRAM device 302, may be removed, exposing a portion of a sidewall of the gate 108 of the SRAM device 302.

Figure 13:
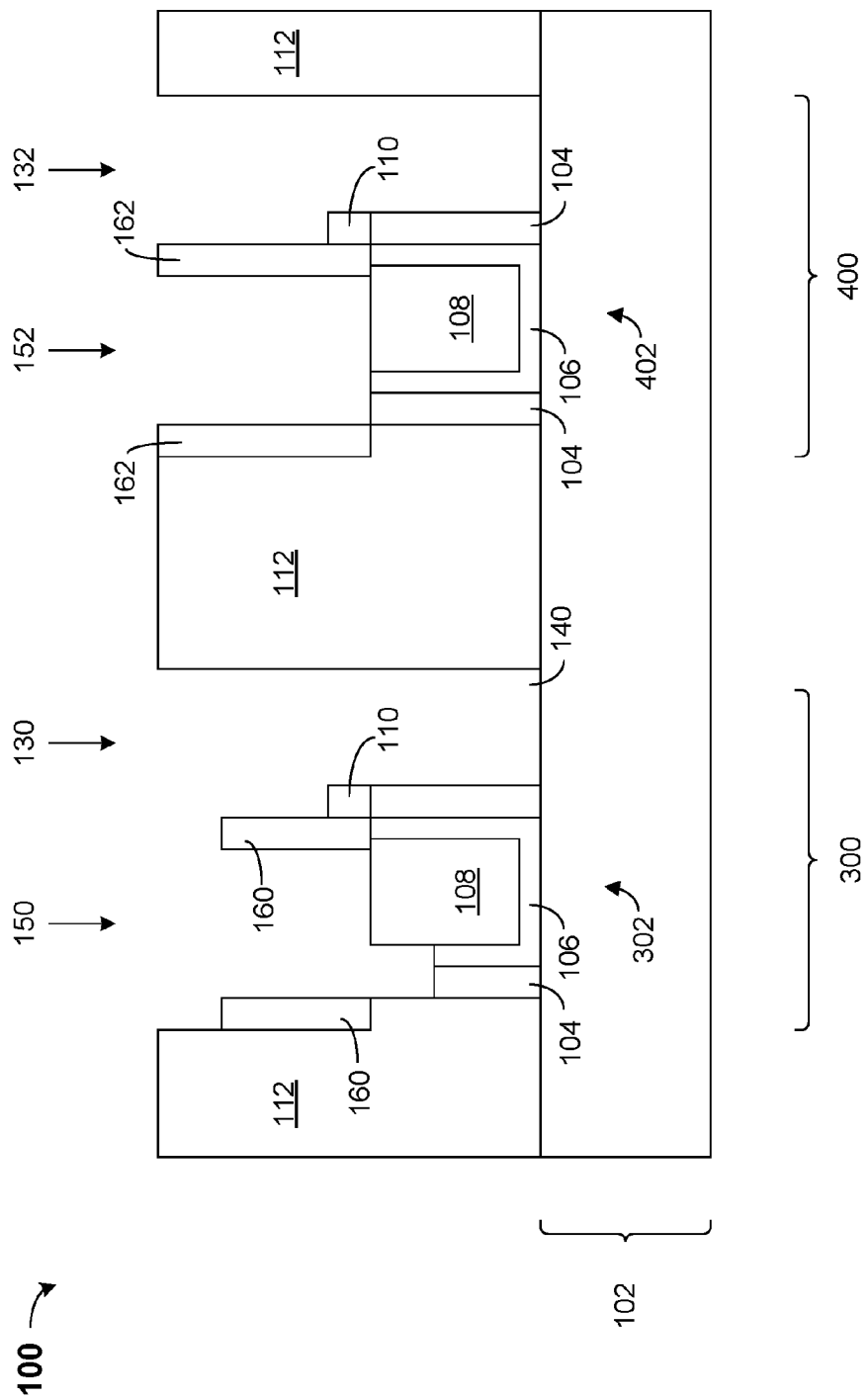
FIG. 13 is a cross-sectional view of the semiconductor structure and illustrates removing the sacrificial material from within the first opening and from within the second opening, according to an exemplary embodiment.

Referring now to FIG. 13, the mask 170 may be removed. The mask 170 may be removed by known etch processes. The first and second sacrificial fillers 190, 192, may also be removed by known etch processes relative to other materials used in this embodiment, exposing the first and second openings 130, 132.

Figure 14:
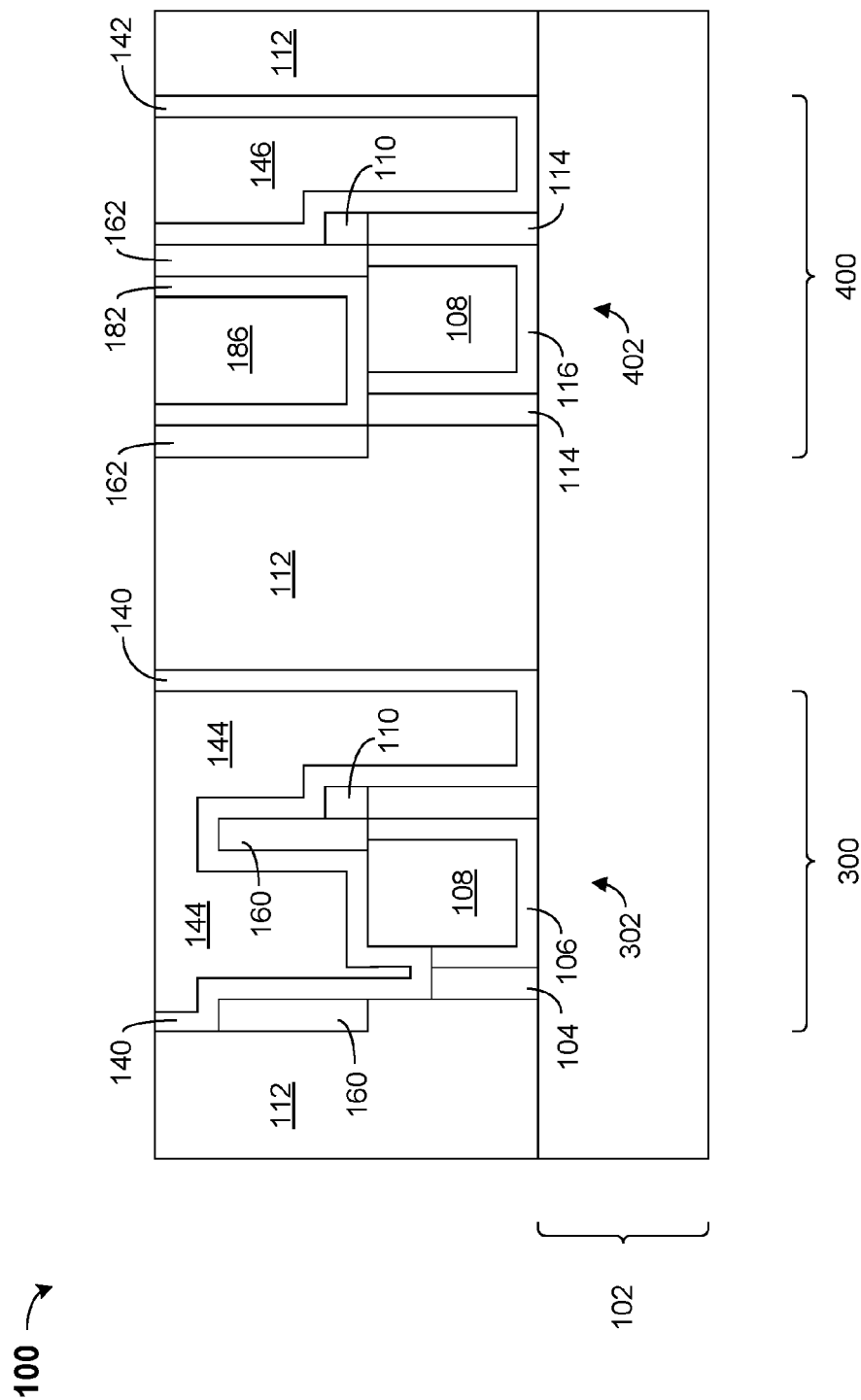
FIG. 14 is a cross-sectional view of the semiconductor structure and illustrates forming source drain contact structures in the first and second openings and forming gate contact structures in the third and fourth openings according to an exemplary embodiment.

Referring now to FIG. 14, a first opening liner 140 and a first contact 144 may be formed in the first opening 130 and in the third opening 150. A second opening liner 142 and a second contact 146 may be formed in the second opening 132. A fourth opening liner 182 and a fourth contact 186 may be formed in the fourth opening 152.

The first, second and fourth opening liners 140, 142, 182, may be deposited using typical deposition techniques, for example, atomic layer deposition (ALD), molecular layer deposition (MLD), chemical vapor deposition (CVD), physical vapor deposition (PVD), and spin on techniques, followed by a directional etch, for example an anisotropic vertical etch process such as a reactive ion etch (RIE). In an embodiment, the first, second and fourth opening liners 140, 142, 182, may include titanium nitride (TiN) deposited using a chemical vapor deposition technique. In an embodiment, the first, second and fourth opening liners 140, 142, 182, may include one or more layers. The first, second and fourth opening liners 140, 142, 182, may be conformally formed on exposed surfaces of the openings (130 and 150), 132, 152, respectively. In an embodiment, the first, second and fourth opening liners 140, 142, 182, may have a thickness, about 3 nm to 20 nm, and ranges there between, although a thickness less than 3 nm and greater than 20 nm may be acceptable.

The first, third and fourth contacts 144, 146, 186, may be a conducting material, such as a metal. In an embodiment, the first, third and fourth contacts 144, 146, 186, may be tungsten (W), and may be deposited using typical deposition techniques, for example, atomic layer deposition (ALD), molecular layer deposition (MLD), chemical vapor deposition (CVD), physical vapor deposition (PVD), and spin on techniques. The first, second and fourth opening liners 140, 142, 182, and the first, third and fourth contacts 144, 146, 186, may be polished using a chemical mechanical polishing (CMP) technique until a top surface of first, second and fourth opening liners 140, 142, 182, and the first, third and fourth contacts 144, 146, 186, is substantially coplanar with a top surface of the dielectric layer 112, as illustrated. Stated differently, top surfaces of each of the first, second and fourth opening liners 140, 142, 182, and the first, third and fourth contacts 144, 146, 186, are substantially flush with a top surface of the dielectric layer 112. In other words, the first, third and fourth contacts 144, 146, 186, may all be within the MOL dielectric.

As illustrated, the first contact 144 and the first opening liner 140 provide a conductive path between the gate 108 of the SRAM device and the source/drain of the SRAM device 302. The first contact 144 may alternatively be referred to as a strapped contact.

Together, the second contact 146 and the second opening liner 142, are separated from the fourth contact 186 and the fourth opening liner 182 by a portion of the second pair of sidewall spacers 162. Therefore, the portion of the pair of sidewall spacers 162 isolates or electrically insulates the gate 108 from the source/drain of the logic device 402.

Figure 15:
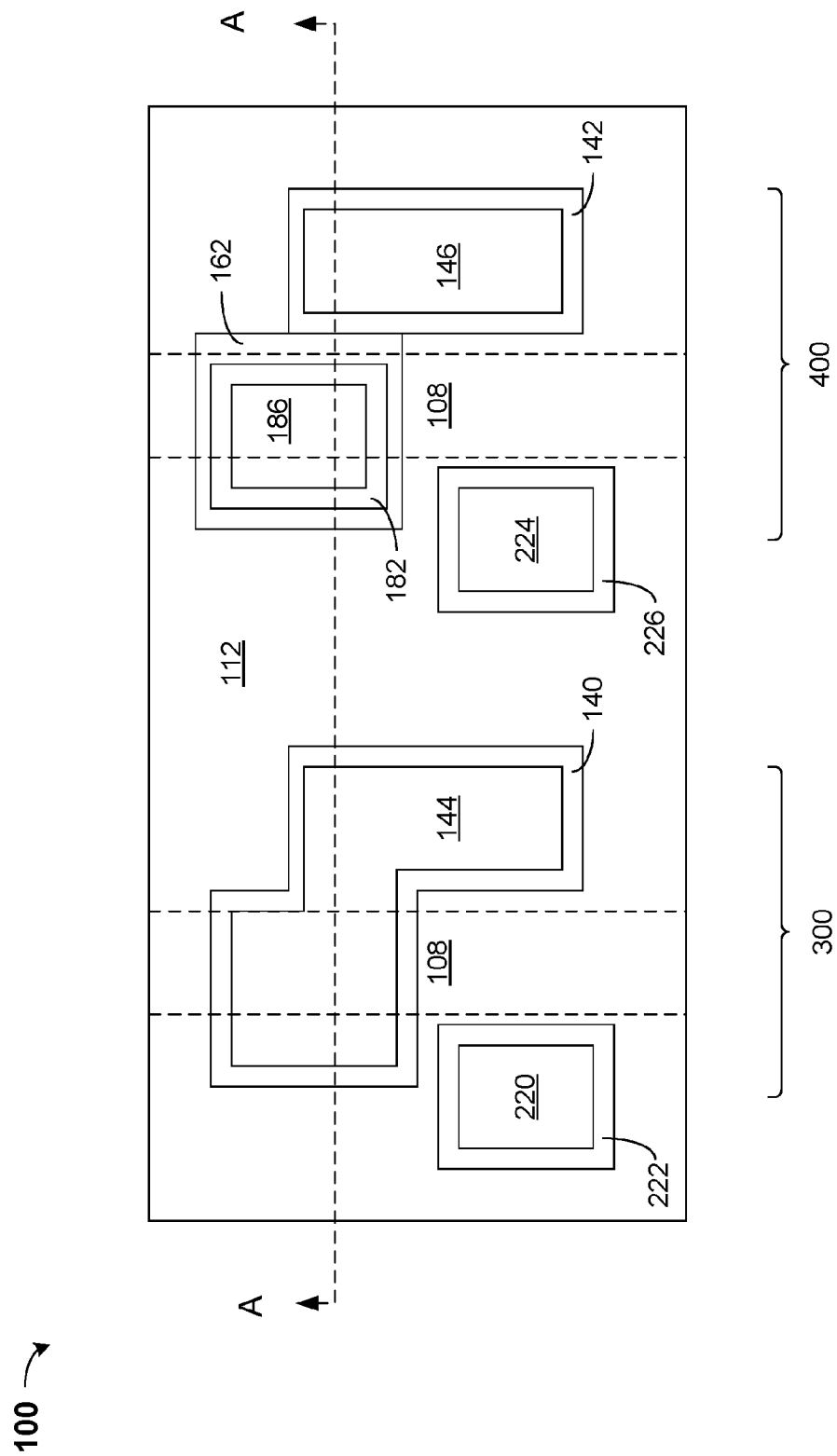
FIG. 15 is a top view of a semiconductor structure depicting in FIG. 14, according to an exemplary embodiment.

Referring now to FIG. 15, a top view of the structure 100 is shown. The line AA depicts a cross sectional line of the FIGS. 1, 2, 9 to 14. The gate 108 of both the SRAM device 302 and the logic device 402 is depicted with dashed lines for added clarity and understanding. The dielectric layer 112 may electrically insulate the contacts of the SRAM device 302 from the contacts of the logic device 402. The first contact 144 and the first opening liner 140 make up the contact for both the gate 108 and the source/drain of the SRAM device 302. Thus, the gate 108 of the SRAM device 302 is electrically connected to the source/drain of the SRAM device 302. A fifth contact 220 and a fifth opening liner 222 make up another source drain contact for the SRAM device 302, which is electrically insulated from the first contact 144.

The second contact 146 and the second opening liner 142 make up the contact for the source/drain of the logic device 402. The fourth contact 186 and the fourth opening liner 182 make up the contact for the gate 108 of the logic device 402. A sixth contact 224 and a sixth opening liner 226 make up a contact for another source/drain of the logic device 402. The contacts for the gate 108 and both source/drains of the logic device 402 are each electrically insulated from one another. Specifically, a portion of the sidewall spacer 162 electrically insulates the second contact 146 from the fourth contact 186.

The previous descriptions refer to the fabrication of an SRAM and a logic device. The process as described can be used for any semiconductor fabrication which has devices which requires both connected gate and source drain regions, and non-connected gate and source drain regions.

As the semiconductor industry evolves, there is a benefit to reduce or combine semiconductor manufacturer process steps. The present invention may allow for the manufacture of devices requiring electrically insulated contacts, as in a logic device, and devices requiring strapped or connected devices, as in an SRAM device. Two embodiments of this invention as described above, describe the fabrication of openings and contacts for the gate and the source/drain regions of each device and a method to form a connected gate and source/drain in some devices, while a pair of sidewall spacers may electrically insulate the gate and source/drain of other devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a first opening in a dielectric layer, the first opening is located in an SRAM device region of a semiconductor structure and exposes a portion of an SRAM source drain region and a portion of an SRAM gate cap, the portion of the SRAM source drain region and the portion of the SRAM gate cap are both of an SRAM finFET device located in the SRAM device region;
   forming a second opening in the dielectric layer, the second opening is located in a logic device region of the semiconductor structure and exposes a portion of a logic source drain region and a portion of a logic gate cap, the portion of the logic source drain region and the portion of the logic gate cap are both of a logic finFET device located in the logic device region;
   forming a first contact by filling the first opening with a conductive material;
   forming a second contact by filling the second opening with the conductive material;
   forming a third opening in the dielectric layer, the third opening is adjacent to the first opening and exposes a portion of a titanium nitride SRAM gate, a portion of an SRAM gate dielectric layer and a portion of an SRAM gate sidewall spacer, all of the SRAM finFET device, wherein a sidewall of the first contact is exposed within the third opening, and wherein a portion of the SRAM gate cap remains directly beneath a portion of the first contact;
   forming a fourth opening in the dielectric layer, the fourth opening is adjacent to the second opening and exposes a portion of a titanium nitride logic gate, a portion of a logic gate dielectric layer and a portion of a logic gate sidewall spacer, all of the logic finFET device, wherein a sidewall of the second contact is exposed within the fourth opening, and wherein a portion of the logic gate cap remains directly beneath a portion of the second contact;
   forming a first pair of sidewall spacers on opposite sidewalls of the third opening, wherein one of the first pair of sidewall spacers is in direct contact with the first contact and vertically extends upward from the exposed surface of the SRAM gate to a top surface of the first contact;
   forming a second pair of sidewall spacers on opposite sidewalls of the fourth opening, wherein one of the second pair of sidewall spacers is in direct contact with the second contact and vertically extends upward from the exposed surface of the logic gate to a top surface of the second contact;
   depositing a hard mask in the logic device region, wherein the hard mask covers the second pair of sidewall spacers;
   recessing a portion of each of the first pair of sidewall spacers, wherein the sidewall of the first contact is re-exposed while the second pair of sidewall spacers remain protected by the hard mask;
   removing the hard mask from the logic device region;
   forming a third contact by filling the third opening with the conductive material, wherein the third contact is in direct contact with the first contact and forms an electrical connection between the SRAM source drain region and the titanium nitride SRAM gate, wherein the electrical connection is directly above a remaining portion of the first sidewall spacer; and
   forming a fourth contact by filling the fourth opening with the conductive material, wherein the second sidewall spacer electrically isolates the fourth contact from the second contact such that the logic source drain region remains electrically isolated from the titanium nitride logic gate.

* * * * *